(12) United States Patent
Lee et al.

(10) Patent No.: US 12,424,250 B2
(45) Date of Patent: Sep. 23, 2025

(54) SEMICONDUCTOR APPARATUS AND SEMICONDUCTOR SYSTEM HAVING INDEPENDENT DATA INPUT/OUTPUT PERIOD, AND OPERATING METHOD OF THE SEMICONDUCTOR SYSTEM

(71) Applicant: SK hynix Inc., Icheon-si (KR)

(72) Inventors: Jae Young Lee, Icheon-si (KR); Won Sun Park, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 166 days.

(21) Appl. No.: 18/297,277

(22) Filed: Apr. 7, 2023

(65) Prior Publication Data

US 2023/0326498 A1    Oct. 12, 2023

Related U.S. Application Data

(60) Provisional application No. 63/328,558, filed on Apr. 7, 2022.

(30) Foreign Application Priority Data

Mar. 24, 2023  (KR) .......................... 10-2023-0038593

(51) Int. Cl.
*G06F 12/00* (2006.01)
*G11C 7/10* (2006.01)

(52) U.S. Cl.
CPC .... *G11C 7/1048* (2013.01); *G11C 2207/2227* (2013.01)

(58) Field of Classification Search
CPC .................. G11C 7/1048; G11C 2207/2227
See application file for complete search history.

(56) References Cited

U.S. PATENT DOCUMENTS

| | | | | |
|---|---|---|---|---|
| 7,296,124 | B1 * | 11/2007 | Falik | G06F 13/1647 |
| | | | | 711/219 |
| 8,732,433 | B2 * | 5/2014 | Chen | G06F 12/0607 |
| | | | | 711/211 |
| 2008/0082730 | A1 | 4/2008 | Kim et al. | |
| 2011/0072200 | A1 * | 3/2011 | Lee | G11C 16/10 |
| | | | | 365/185.23 |
| 2022/0398043 | A1 * | 12/2022 | Yasuda | G06F 3/0679 |
| 2023/0352083 | A1 * | 11/2023 | Sasaki | G11C 11/4087 |

FOREIGN PATENT DOCUMENTS

KR          101093620 B1    12/2011

* cited by examiner

*Primary Examiner* — Min Huang
(74) *Attorney, Agent, or Firm* — WILLIAM PARK AND ASSOCIATES LTD.

(57) ABSTRACT

A semiconductor system includes a first semiconductor apparatus and a second semiconductor apparatus. The first semiconductor apparatus provides the second semiconductor apparatus with a chip enable signal and a command address signal set, and the second semiconductor apparatus performs an internal operation based on the chip enable signal and the command address signal set. The first semiconductor apparatus provides the second semiconductor apparatus with a selection chip enable command, and the second semiconductor apparatus transmits data to the first semiconductor apparatus or receives the data from the first memory device after receiving the selection chip enable command.

35 Claims, 9 Drawing Sheets

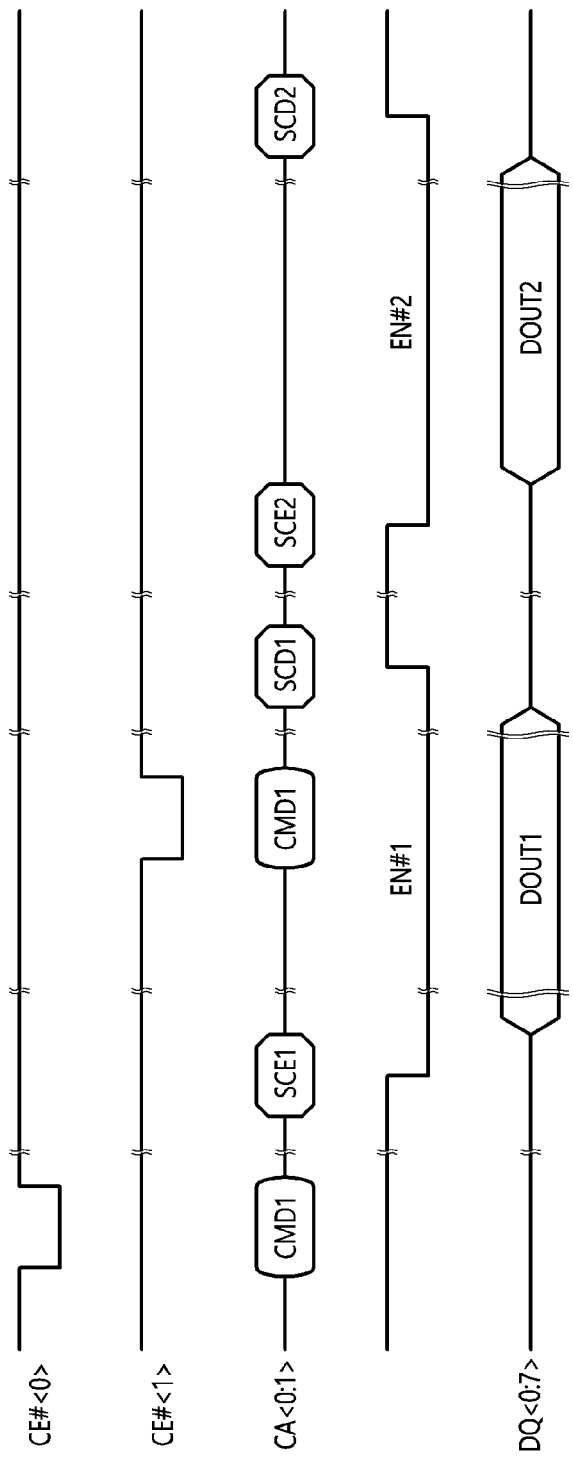

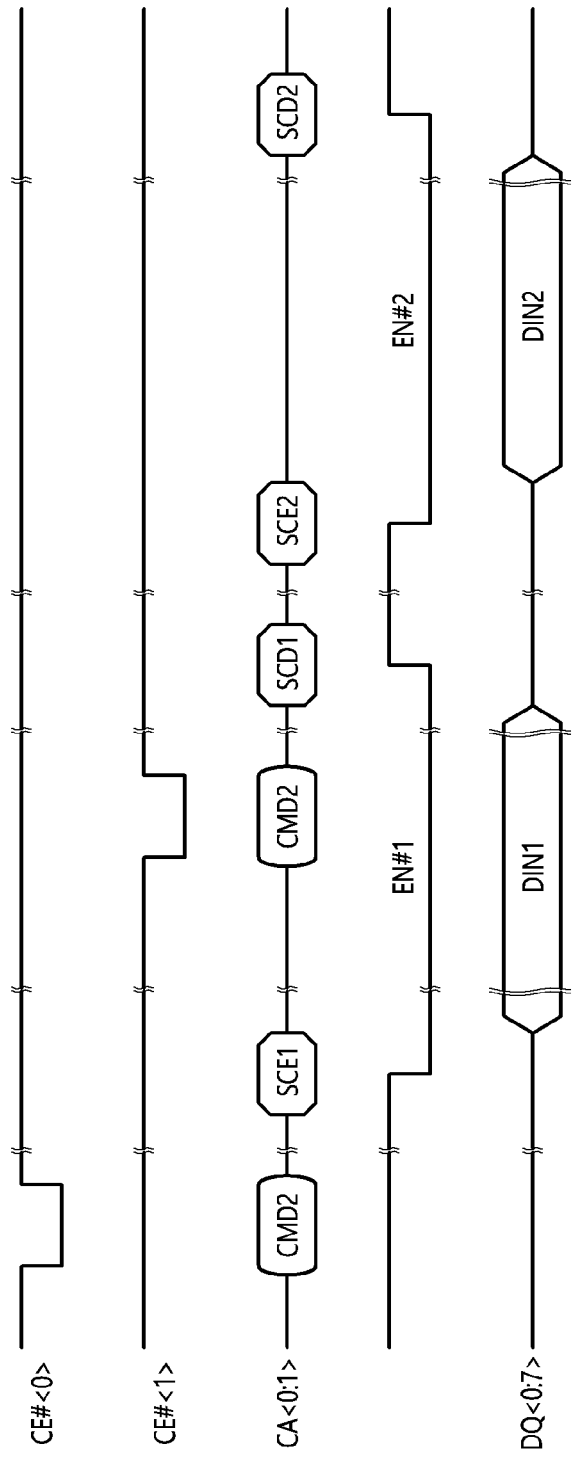

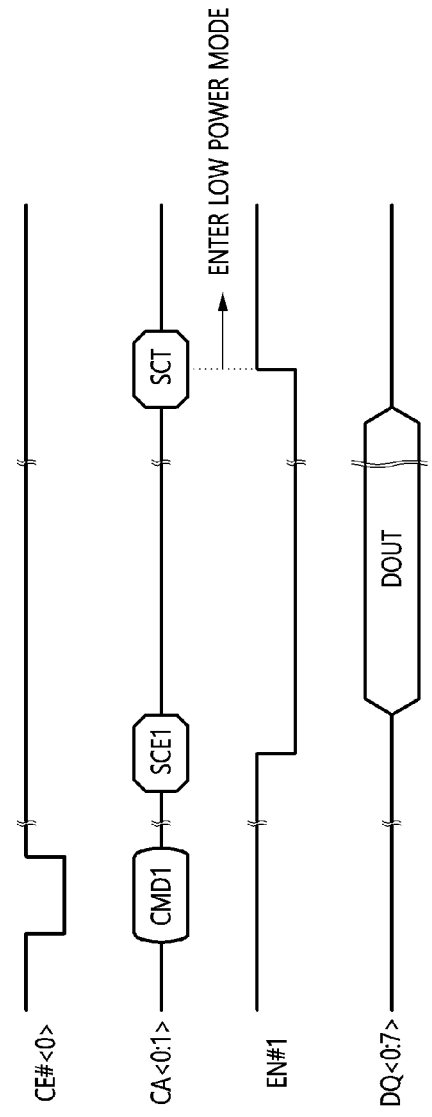

FIG. 7

| FIRST HEADER | | SECOND HEADER | | DEFINITION |
|---|---|---|---|---|
| CA<0> | CA<1> | CA<0> | CA<1> | |
| 0 | 0 | 0 | 0 | Data Output |
| 0 | 0 | 0 | 1 | Data Input |
| 1 | 0 | 0 | 0 | Address Input |
| 0 | 1 | 0 | 0 | Command Input |
| 1 | 1 | 1 | 0 | SCE |
| 1 | 1 | 0 | 1 | SCD |
| 1 | 1 | 1 | 1 | SCT |
| 1 | 1 | 0 | 0 | LUN Selection |

| | FIRST BODY | SECOND BODY | THIRD BODY | FOURTH BODY |
|---|---|---|---|---|
| CA<0> | S0 | S2 | S4 | S6 |
| CA<1> | S1 | S3 | S5 | S7 |

SEMICONDUCTOR APPARATUS AND SEMICONDUCTOR SYSTEM HAVING INDEPENDENT DATA INPUT/OUTPUT PERIOD, AND OPERATING METHOD OF THE SEMICONDUCTOR SYSTEM

CROSS-REFERENCES TO RELATED APPLICATIONS

The present application claims the benefit under 35 U.S.C. § 119 (e) of U.S. Provisional application No. 63/328,558, filed on Apr. 7, 2022, and claims priority to Korean application number 10-2023-0038593, filed on Mar. 24, 2023, in the Korean Intellectual Property Office, which are incorporated herein by reference in their entirety.

BACKGROUND

1. Technical Field

The present technology relates to an integrated circuit technology, and more particularly, to a semiconductor apparatus and semiconductor system having a data input/output period.

2. Related Art

Electronic devices may include many electronic components. Among the electronic devices, a computer system may include many semiconductor apparatuses made of a semiconductor. The semiconductor apparatuses that constitute the computer system may include a processor or memory controller operating as a master device and a memory device or storage device operating as a slave device. The master device may provide the slave device with a command address signal, and the slave device may perform various operations based on the command address signal. In addition, the master device and the slave device may transmit and receive data to and from each other.

In a NAND flash memory system, a NAND flash memory device may communicate with a memory controller through various interface methods. In a NAND interface method, a command address signal and data may be transmitted through the same input/output bus. As an operating frequency of the NAND flash memory system increases, command overhead increases in the NAND interface method, which may cause performance degradation of the memory system. In a separate command address (SCA) interface method, a command address signal and data may be transmitted through different input/output buses. Although the command overhead may partially decrease in the SCA interface method, it is difficult to perform operations of a plurality of NAND flash memory devices in parallel.

SUMMARY

A semiconductor system according to an embodiment may include a first semiconductor apparatus and a second semiconductor apparatus. The first semiconductor apparatus may be configured to provide a chip enable signal and a first command address signal set, and then provide a second command address signal set that defines a data input and output (input/output) period. The second semiconductor apparatus may be configured to perform an internal operation based on the chip enable signal and the first command address signal set, and connected to the first semiconductor apparatus through a data bus based on the second command address signal set.

An operating method of a semiconductor system according to an embodiment may include providing, by a first semiconductor apparatus, a second semiconductor apparatus with one of a data input command and a data output command and a chip enable signal. The operating method may include performing, by the second semiconductor apparatus, an internal operation based on the chip enable signal, and the one of the data input command and the data output command. The operating method may include providing, by the first semiconductor apparatus, the second semiconductor apparatus with a selection chip enable command. And the operating method may include transmitting, by the first semiconductor apparatus, data to the second semiconductor apparatus, or transmitting, by the second semiconductor apparatus, the data to the first semiconductor apparatus.

A semiconductor system according to an embodiment may include a semiconductor apparatus, a first memory die, and a second memory die. The semiconductor apparatus may be configured to provide a first chip enable signal, a second chip enable signal, a first command address signal set, a second command address signal set, and a third command address signal set, wherein the semiconductor apparatus is connected to a data bus. The first memory die may be configured to perform an internal operation based on the first chip enable signal and the first command address signal set, wherein the first memory die is connected to the data bus based on the second command address signal set. The second memory die may be configured to perform an internal operation based on the second chip enable signal and the first command address signal set, wherein the second memory die is connected to the data bus based on the third command address signal set.

An operating method of a semiconductor system according to an embodiment may include providing, by a semiconductor apparatus, a first memory die with a first chip enable signal and a command address signal set. The operating method may include providing, by the semiconductor apparatus, the first memory die with a first selection chip enable command. The operating method may include receiving, by the semiconductor apparatus, data from the first memory die or transmitting, by the semiconductor apparatus, the data to the first memory die. And the operating method may include providing, by the semiconductor apparatus, the first memory die with one of a first selection chip disable command and a first selection chip termination command.

BRIEF DESCRIPTION OF THE DRAWINGS

FIG. 3A is a diagram illustrating an operation of a semiconductor system according to an embodiment of the present technology.

FIG. 3B is a diagram illustrating an operation of a semiconductor system according to an embodiment of the present technology.

FIG. 4 is a diagram illustrating an operation of a semiconductor system according to an embodiment of the present technology.

FIG. 7 is a table illustrating a command address signal set according to an embodiment of the present technology.

DETAILED DESCRIPTION

Hereinafter, embodiments of the present technology will be described in more detail with reference to the accompanying drawings.

Figure 1:
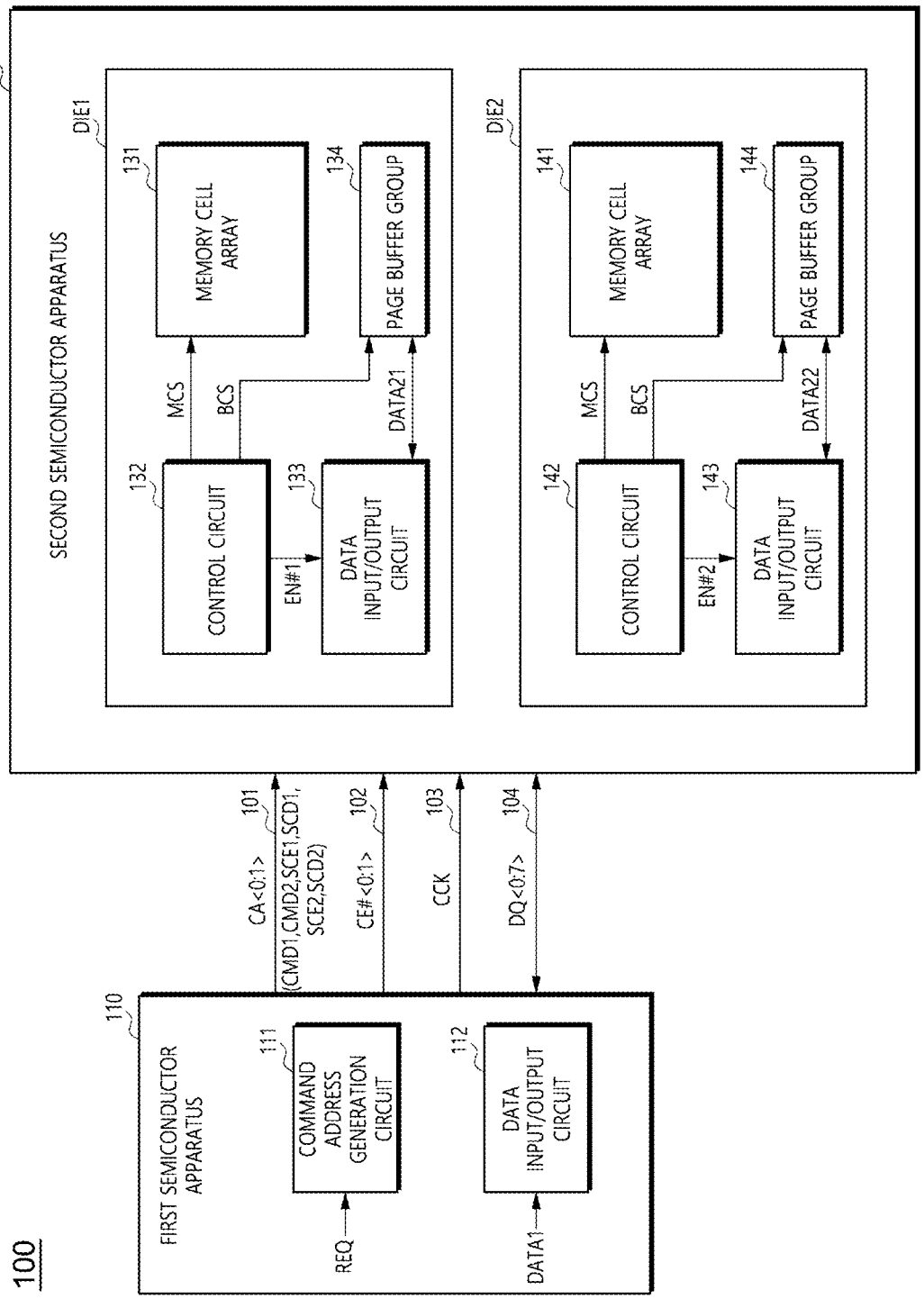
FIG. 1 is a diagram illustrating a construction of a semiconductor system according to an embodiment of the present technology.

FIG. 1 is a diagram illustrating a construction of a semiconductor system 100 according to an embodiment of the present technology. In FIG. 1, the semiconductor system 100 may include a first semiconductor apparatus 110 and a second semiconductor apparatus 120. The first semiconductor apparatus 110 may provide various control signals that are necessary for the second semiconductor apparatus 120 to operate. The first semiconductor apparatus 110 may include various types of master devices. For example, the first semiconductor apparatus 110 may be a host device, such as a central processing unit (CPU), a graphic processing unit (GPU), a multi-media processor (MMP), a digital signal processor, an application processor (AP), and a memory controller. The second semiconductor apparatus 120 may be a slave device, for example, a memory device, that performs various operations under the control of the first semiconductor apparatus 110. The memory device may include volatile memory and nonvolatile memory. The volatile memory may include static RAM (SRAM), dynamic RAM (DRAM), and synchronous DRAM (SDRAM). The nonvolatile memory may include read-only memory (ROM), programmable ROM (PROM), electrically erasable PROM (EEPROM), electrically programmable ROM (EPROM), flash memory, phase change RAM (PRAM), magnetic RAM (MRAM), resistive RAM (RRAM), and ferroelectric RAM (FRAM).

The first semiconductor apparatus 110 may be connected to the second semiconductor apparatus 120 through a plurality of buses. The plurality of buses may each be a signal transmission path, link, or channel for transmitting a signal. The plurality of buses may include a command address bus 101, a chip enable bus 102, a command clock bus 103, and a data bus 104. Each of the command address bus 101, the chip enable bus 102, and the command clock bus 103 may be a unidirectional bus from the first semiconductor apparatus 110 to the second semiconductor apparatus 120, and the data bus 104 may be a bidirectional bus. The first semiconductor apparatus 110 may provide the second semiconductor apparatus 120 with command address signals CA<0:1> through the command address bus 101. The command address signals CA<0:1> transmitted by the first semiconductor apparatus 110 may include a command signal and an address signal. The command signal may include command information specifying an operation performed by the second semiconductor apparatus 120. The address signal ADD may include address information for accessing a storage area of the second semiconductor apparatus 120. For example, the command signal may include a data input command, a data output command, a selection chip enable command, and a selection chip disable command. In one embodiment, the command signal may further include a selection chip termination command. The first semiconductor apparatus 110 may transmit the 2-bit command address signals CA<0:1> to the second semiconductor apparatus 120 for each unit cycle through the command address bus 101. The command address signals CA<0:1> transmitted during a plurality of cycles may constitute one command address signal set. The first semiconductor apparatus 110 may transmit chip enable signals CE#<0:1> to the second semiconductor apparatus 120 through the chip enable bus 102. Although FIG. 1 illustrates that the chip enable signals include 2 bits, the number of bits of the chip enable signal CE#<0:1> may vary depending on the number of memory dies or memory chips included in the second semiconductor apparatus 120. For example, when the second semiconductor apparatus 120 includes two memory dies or memory chips, the first semiconductor apparatus 110 may provide the second semiconductor apparatus 120 with a first chip enable signal CE#<0> and a second chip enable signal CE#<1> through the chip enable bus 102. The first and second chip enable signals CE#<0> and CE#<1> may be provided together with the command address signals CA<0:1>. For example, the first semiconductor apparatus 110 may provide the second semiconductor apparatus 120 with the command address signals CA<0:1> and the first chip enable signal CE#<0> together to operate a first memory die DIE1 of the second semiconductor apparatus 120. The first semiconductor apparatus 110 may transmit the command address signals CA<0:1> and the second chip enable signal CE#<1> together to the second semiconductor apparatus 120 to operate a second memory die DIE2 of the second semiconductor apparatus 120.

The first semiconductor apparatus 110 may provide the second semiconductor apparatus 120 with a command clock signal CCK through the command clock bus 103. The command clock signal CCK may be a signal synchronized with the command address signals CA<0:1>, and a signal defining a period in which the second semiconductor apparatus 120 receives the command address signals CA<0:1> as valid signals. For example, in a period in which the command clock signal CCK toggles, the second semiconductor apparatus 120 may sample the command address signals CA<0:1>, which are transmitted from the first semiconductor apparatus 110, as the valid signals. The first semiconductor apparatus 110 may provide the second semiconductor apparatus 120 with data DQ<0:7> through the data bus 104, or receive the data DQ<0:7> from the second semiconductor apparatus 120. Such an operation of transmitting the data DQ<0:7> from the first semiconductor apparatus 110 to the second semiconductor apparatus 120 may be a data input operation, and such an operation of transmitting the data DQ<0:7> from the second semiconductor apparatus 120 to the first semiconductor apparatus 110 may be a data output operation.

The first semiconductor apparatus 110 may include a command address generation circuit 111 and a data input/output circuit 112. The command address generation circuit 111 may generate the command address signals CA<0:1> and the chip enable signals CE#<0:1> based on a request REQ of a user. The command address generation circuit 111 may transmit the command address signals CA<0:1> to the second semiconductor apparatus 120 through the command address bus 101, and transmit the chip enable signals CE#<0:1> to the second semiconductor apparatus 120 through the chip enable bus 102. The command address generation circuit 111 may transmit the command address signals CA<0:1> to the second semiconductor apparatus 120 during a plurality of cycles, depending on the length and/or total number of bits of the command address signal set. The command address generation circuit 111 may sequentially transmit one of a first command address signal set, a second command address signal set, and a third command address signal set so that the second semiconductor apparatus 120 may perform at least one specific operation. The first command address signal set may include a command capable of specifying types of operation performed by the second semiconductor apparatus 120. The second and third command address signal sets may define a data input/output period of the second semiconductor apparatus 120. The command address generation circuit 111 may transmit the first command address signal set together with the chip enable signals CE#<0:1> to the second semiconductor apparatus 120. The command address generation circuit 111 might not transmit the chip enable signals CE#<0:1> to the second semiconductor apparatus 120 when transmitting the second and third command address signal sets to the second semiconductor apparatus 120. Each of the second and third command address signal sets may include selection information for selecting one of a plurality of memory dies included in the second semiconductor apparatus 120.

The first command address signal set may include at least one of a data output command CMD1 and a data input command CMD2. In one embodiment, the data output command CMD1 may be a random data output command. The random data output command may be a command signal instructing an operation of changing a column address signal after a page read operation of the second semiconductor apparatus 120 is performed, and transmitting data read by the second semiconductor apparatus 120 as the data DQ to the first semiconductor apparatus 110 based on the changed column address signal. The data input command CMD2 may be a random data input command. The random data input command may be a command signal instructing an operation of transmitting the data DQ to be used for a page program operation from the first semiconductor apparatus 110 to the second semiconductor apparatus 120 before the page program operation of the second semiconductor apparatus 120 is performed.

When the second semiconductor apparatus 120 includes the first and second memory dies DIE1 and DIE2, the second command address signal set may include at least a first selection chip enable command SCE1 and a first selection chip disable command SCD1. The third command address signal set may include at least a second selection chip enable command SCE2 and a second selection chip disable command SCD2. The first selection chip enable command SCE1 and the first selection chip disable command SCD1 may define the data input/output period of the first memory die DIE1 and/or a period in which the first memory die DIE1 is connected to the data bus 104. The second selection chip enable command SCE2 and the second selection chip disable command SCD2 may define the data input/output period of the second memory die DIE2 and/or a period in which the second memory die DIE2 is connected to the data bus 104. The data input/output period of the first memory die DIE1 and the data input/output period of the second memory die DIE2 might not overlap, and may be set independently of each other. The command address generation circuit 111 may transmit one of the second and first selection chip enable commands SCE2 and SCE1 after transmitting one of the first and second selection chip disable commands SCD1 and SCD2, to prevent data input/output periods of the first and second memory dies DIE1 and DIE2 from overlapping. In an embodiment, the second command address signal set may further include a first selection chip termination command, and the third command address signal set may further include a second selection chip termination command. The first and second selection chip disable commands SCD1 and SCD2 may be replaced by the first and second selection chip termination commands. The first and second selection chip termination commands are described later.

The data input and output (input/output) circuit 112 may be connected to the data bus 104, and may transmit and receive the data DQ<0:7> to and from the second semiconductor apparatus 120 through the data bus 104. During the data output operation, the data input/output circuit 112 may receive the data DQ<0:7> from the second semiconductor apparatus 120, and generate internal data DATA1. During the data input operation, the data input/output circuit 112 may generate the data DQ<0:7> from the internal data DATA1, and transmit the data DQ<0:7> to the second semiconductor apparatus 120. After the second command address signal set or the third command address signal set is transmitted by the command address generation circuit 111, the data input/output circuit 112 may receive the data DQ<0:7> from the second semiconductor apparatus 120 during the data output operation. After the second command address signal set or the third command address signal set is transmitted by the command address generation circuit 111, the data input/output circuit 112 may transmit the data DQ<0:7> to the second semiconductor apparatus 120 during the data input operation.

The second semiconductor apparatus 120 may include the plurality of memory dies. Each of the plurality of memory dies may perform a data input/output operation independently of the first semiconductor apparatus 110. For example, the second semiconductor apparatus 120 may include at least the first memory die DIE1 and the second memory die DIE2. The first and second memory dies DIE1 and DIE2 may have substantially the same configuration. The first and second memory dies DIE1 and DIE2 may include memory cell arrays 131 and 141, respectively. Each of the memory cell arrays 131 and 141 may include a plurality of planes. Each of the plurality of planes may include a plurality of blocks. One block may refer to a unit that can be erased at one time. Each of the plurality of blocks may include a plurality of pages. Each of the pages may refer to a unit that can be programmed or read at one time. Each of the plurality of blocks may be composed of the plurality of pages and a plurality of strings, and a plurality of memory cells may be connected to intersections of the plurality of pages and the plurality of strings. When a specific page among the plurality of pages and a specific string among the plurality of strings are selected, a memory cell connected between the selected page and the selected string may be accessed. Although not illustrated, the memory cell arrays 131 and 141 may each include a row decoding circuit for selecting a specific page based on a row address signal and a column decoding circuit for selecting a specific string based on a column address signal.

The first memory die DIE1 may include a control circuit 132, a data input/output circuit 133, and a page buffer group 134. The control circuit 132 may be connected to the command address bus 101, the chip enable bus 102, and the command clock bus 103, and receive the command address signals CA<0:1>, the chip enable signals CE#<0:1>, and the command clock signal CCK from the first semiconductor apparatus 110 through the command address bus 101, the chip enable bus 102, and the command clock bus 103. The control circuit 132 may generate a memory cell array control signal MCS and a buffer control signal BCS based on the command address signals CA<0:1>, the chip enable signals CE#<0:1> and the command clock signal CCK. The control circuit 132 may provide the memory cell array 131 with the memory cell control signal MCS, and provide the page buffer group 134 with the buffer control signal BCS. The control circuit 132 may receive the first chip enable signal CE#<0>. The control circuit 132 may generate the memory cell array control signal MCS and the buffer control signal BCS based on the command address signals CA<0:1> received together with the first chip enable signal CE#<0>. For example, the control circuit 132 may generate the memory cell array control signal MCS and the buffer control signal BCS according to the first command address signal set when the first chip enable signal CE#<0> is enabled. The control circuit 132 might not generate the memory cell array control signal MCS and the buffer control signal BCS even though the first command address signal set is inputted when the first chip enable signal CE#<0> is disabled. Although not limited thereto, the memory cell array control signal MCS may include a low voltage, the row address signal, and the column address signal. The low voltage may have various voltage levels depending on types of operation performed by the first memory die DIE1. For example, the low voltage may include a plurality of program voltages, a plurality of verification voltages, a plurality of read voltages, a plurality of erase voltages, or a plurality of pass voltages. The low voltage may be applied to a page selected by the row address signal. The row address signal and the column address signal may be generated based on an address signal included in the command address signals CA<0:1>. The buffer control signal BCS may include a plurality of control signals so that the page buffer group 134 may perform write and read operations on the memory cell array 131.

The control circuit 132 may generate a first data enable signal EN#1 based on the command address signals CA<0:1>. The control circuit 132 may provide the data input/output circuit 133 with the first data enable signal EN#1. When receiving the second command address signal set, the control circuit 132 may enable the first data enable signal EN#1 based on the second command address signal set. An enable period of the first data enable signal EN#1 may be defined based on the second command address signal set. For example, the control circuit 132 may enable the first data enable signal EN#1 based on the first selection chip enable signal SCE1, and disable the first data enable signal EN#1 based on the first selection chip disable command SCD1.

The data input/output circuit 133 may be connected to the data bus 104, and be connected to the first semiconductor apparatus 110 through the data bus 104. When the first memory die DIE1 performs the data output operation based on the data output command CMD1, the data input/output circuit 133 may receive internal data DATA21 of the first memory die DIE1 from the page buffer group 134. The data input/output circuit 133 may generate the data DQ<0:7> based on the internal data DATA21 of the first memory die DIE1, and transmit the data DQ<0:7> to the first semiconductor apparatus 110 through the data bus 104. When the first memory die DIE1 performs the data input operation based on the data input command CMD2, the data input/output circuit 133 may receive the data DQ<0:7> from the first semiconductor apparatus 110 through the data bus 104, and generate the internal data DATA21 of the first memory die DIE1 based on the data DQ<0:7>. The data input/output circuit 133 may provide the page buffer group 134 with the internal data DATA21 of the first memory die DIE1. The data input/output circuit 133 may include a serializer-deserializer SERDES that serializes the internal data DATA21 of the first memory die DIE1 to generate the data DQ<0:7> or parallelizes the data DQ<0:7> to generate the internal data DATA21. The data input/output circuit 133 may receive the first data enable signal EN#1 from the control circuit 132. The data input/output circuit 133 may be selectively connected to the data bus 104 based on the first data enable signal EN#1. For example, when the first data enable signal EN#1 is enabled, the data input/output circuit 133 may be connected to the data bus 104, and when the first data enable signal EN#1 is disabled, the data input/output circuit 133 may be disconnected from the data bus 104.

The page buffer group 134 may receive the buffer control signal BCS from the control circuit 132, and be connected to a string selected by the column address signal. The page buffer group 134 may include the same number of page buffers as the plurality of strings included in the memory cell array 131, and a plurality of page buffers may be connected to the plurality of strings in a one-to-one manner. The page buffer group 134 may set up voltage levels of the plurality of strings based on the buffer control signal BCS. The page buffer group 134 may read data stored in the memory cell array 131 based on the buffer control signal BCS, and generate the internal data DATA21 of the first memory die DIE1 from the read data. The page buffer group 134 may write and/or program the internal data DATA21 of the first memory die DIE1 to the memory cell array 131 based on the buffer control signal BCS.

When the first memory die DIE1 performs the data output operation based on the data output command CMD1, the page buffer group 134 may read the data stored in the memory cell array 131 based on the buffer control signal BCS, and output the read data as the internal data DATA21 of the first memory die DIE1. The control circuit 132 may serialize the internal data DATA21, and generate the data DQ<0:7>. When the first data enable signal EN#1 is enabled, the data input/output circuit 133 may transmit the data DQ<0:7> to the first semiconductor apparatus 110 through the data bus 104. When the first memory die DIE1 performs the data input operation based on the data input command CMD2, the page buffer group 134 may reset latch values of latch circuits included in the plurality of page buffers, based on the buffer control signal BCS. When the first data enable signal EN#1 is enabled, the data input/output circuit 133 may receive the data DQ<0:7> from the first semiconductor apparatus 110 through the data bus 104, and generate the internal data DATA21 by parallelizing the data DQ<0:7>. The page buffer group 134 may set a latch value corresponding to the internal data DATA21.

The second memory die DIE2 may include a control circuit 142, a data input/output circuit 143, and a page buffer group 144. The control circuit 142, the data input/output circuit 143, and the page buffer group 144 may have substantially the same configuration as the control circuit 132, the data input/output circuit 133, and the page buffer group 134 of the first memory die DIE1, and perform substantially the same functions. Redundant descriptions of substantially the same functions performed by substantially the same components are omitted. The control circuit 142 may receive the second chip enable signal CE#<1>. The control circuit 142 may generate the memory cell array control signal MCS and the buffer control signal BCS based on the command address signals CA<0:1> received together with the second chip enable signal CE#<1>. For example, the control circuit 142 may generate the memory cell array control signal MCS and the buffer control signal BCS according to the first command address signal set when the second chip enable signal CE#<1> is enabled. The control circuit 142 might not generate the memory cell array control signal MCS and the buffer control signal BCS even though the first command address signal set is inputted when the second chip enable signal CE#<1> is disabled.

The control circuit 142 may generate a second data enable signal EN#2 based on the command address signals CA<0:1>. The control circuit 142 may provide the data input/output circuit 143 with the second data enable signal EN#2. When receiving the third command address signal set, the control circuit 142 may enable the second data enable signal EN#2 based on the third command address signal set. An enable period of the second data enable signal EN#2 may be defined based on the third command address signal set. For example, the control circuit 142 may enable the second data enable signal EN#2 based on the second selection chip enable signal SCE2, and disable the second data enable signal EN#2 based on the second selection chip disable command SCD2.

The data input/output circuit 143 may be connected to the data bus 104, and be connected to the first semiconductor apparatus 110 through the data bus 104. When the second memory die DIE2 performs the data output operation based on the data output command CMD1, the data input/output circuit 143 may receive internal data DATA22 of the second memory die DIE2 from the page buffer group 144. The data input/output circuit 143 may generate the data DQ<0:7> based on the internal data DATA22, and transmit the data DQ<0:7> to the first semiconductor apparatus 110 through the data bus 104. When the second memory die DIE2 performs the data input operation based on the data input command CMD2, the data input/output circuit 143 may receive the data DQ<0:7> from the first semiconductor apparatus 110 through the data bus 104, and generate the internal data DATA22 based on the data DQ<0:7>. The data input/output circuit 143 may provide the page buffer group 144 with the internal data DATA22. The data input/output circuit 143 may include a serializer-deserializer SERDES that serializes the internal data DATA22 to generate the data DQ<0:7> or parallelizes the data DQ<0:7> to generate the internal data DATA22. The data input/output circuit 143 may receive the second data enable signal EN#2 from the control circuit 142. The data input/output circuit 143 may be selectively connected to the data bus 104 based on the second data enable signal EN#2. For example, when the second data enable signal EN#2 is enabled, the data input/output circuit 143 may be connected to the data bus 104, and when the second data enable signal EN#2 is disabled, the data input/output circuit 143 may be disconnected from the data bus 104.

When the second memory die DIE2 performs the data output operation based on the data output command CMD1, the page buffer group 144 may read data stored in the memory cell array 141, based on the buffer control signal BCS, and output the read data as the internal data DATA22 of the second memory die DIE2. The data input/output circuit 143 may serialize the internal data DATA22, and generate the data DQ<0:7>. When the second data enable signal EN#2 is enabled, the data input/output circuit 143 may transmit the data DQ<0:7> to the first semiconductor apparatus 110 through the data bus 104. When the second memory die DIE2 performs the data input operation based on the data input command CMD1, the page buffer group 144 may reset latch values of latch circuits included in the plurality of page buffers, based on the buffer control signal BCS. When the second data enable signal EN#2 is enabled, the data input/output circuit 143 may receive the data DQ<0:7> from the first semiconductor apparatus 110 through the data bus 104, and generate the internal data DATA22 by serializing the data DQ<0:7>. The page buffer group 144 may set a latch value corresponding to the internal data DATA22.

Figure 2A:
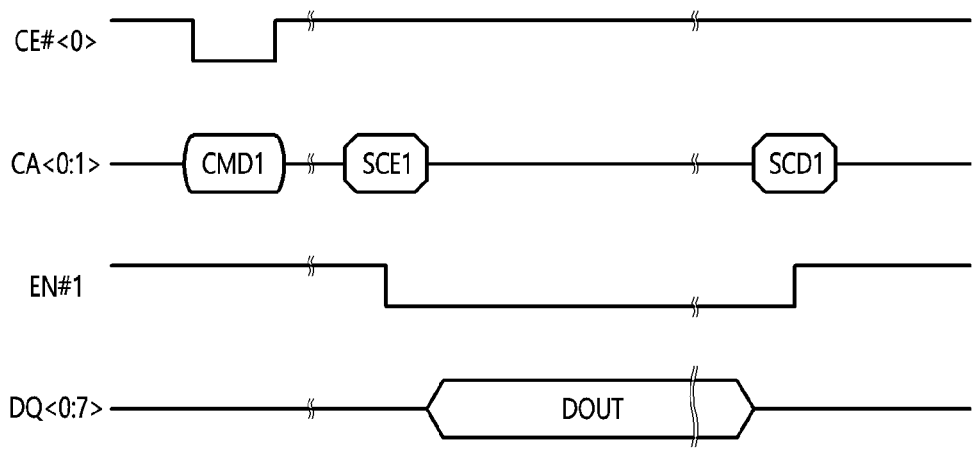
FIG. 2A is a diagram illustrating an operation of a semiconductor system according to an embodiment of the present technology.

FIG. 2A is a diagram illustrating an operation of the semiconductor system 100 according to an embodiment of the present technology. FIG. 2A may illustrate the data output operation performed by the first memory die DIE1 of FIG. 1. Referring to FIGS. 1 and 2A, the first semiconductor apparatus 110 may provide the second semiconductor apparatus 120 with the first chip enable signal CE#<0> and the command address signals CA<0:1> corresponding to the first command address signal set, to instruct the first memory die DIE1 to perform the data output operation. The first command address signal set may include the data output command CMD1. The first memory die DIE1 may receive the data output command CMD1 as a valid command based on the enabled first chip enable signal CE#<0>, and perform an internal operation based on the data output command CMD1. The control circuit 132 of the first memory die DIE1 may generate the memory cell array control signal MCS and the buffer control signal BCS based on the data output command CMD1, and the page buffer group 134 may read data stored in the memory cell array 131, and generate the internal data DATA21 of the first memory die DIE1. The data input/output circuit 133 may serialize the internal data DATA21 of the first memory die DIE1, and generate the data DQ<0:7> and DOUT.

After providing the second semiconductor apparatus 120 with the first chip enable signal CE#<0> and the first command address signal set, the first semiconductor apparatus 110 may provide the second semiconductor apparatus 120 with the command address signals CA<0:1> corresponding the second command address signal set. When providing the second semiconductor apparatus 120 with the second command address signal set, the first semiconductor apparatus 110 might not provide the second semiconductor apparatus 120 with the first chip enable signal CE#<0>. The first semiconductor apparatus 110 may maintain the first chip enable signal CE#<0> in a disabled state. The second command address signal set may include selection information for selecting the first memory die DIE1, and include the first selection chip enable command SCE1 and the first selection chip disable command SCD1. After providing the second semiconductor apparatus 120 with the first chip enable signal CE#<0> and the first command address signal set, the first semiconductor apparatus 110 may provide the second semiconductor apparatus 120 with the first selection chip enable command SCE1. The control circuit 132 may enable the first data enable signal EN#1 based on the first selection chip enable command SCE1. When the first data enable signal EN#1 is enabled, the data input/output circuit 133 may be connected to the data bus 104, and transmit the data DOUT to the first semiconductor apparatus 110 through the data bus 104. The first semiconductor apparatus 110 may provide the second semiconductor apparatus 120 with the first selection chip disable command SCD1 after providing the second semiconductor apparatus 120 with the first selection chip enable command SCE1. In an embodiment, the first semiconductor apparatus 110 may provide the second semiconductor apparatus 120 with the first selection chip disable command SCD1 at the point of time at which the data DOUT is completely transmitted from the second semiconductor apparatus 120. In an embodiment, the first semiconductor apparatus 110 may provide the second semiconductor apparatus 120 with the first selection chip disable command SCD1 when a predetermined time elapses after providing the second semiconductor apparatus 120 with the first selection chip enable command SCE1. The control circuit 132 may disable the first data enable signal EN#1 based on the first selection chip disable command SCD1. When the first data enable signal EN#1 is disabled, the data input/output circuit 133 may be disconnected from the data bus 104.

Figure 2B:
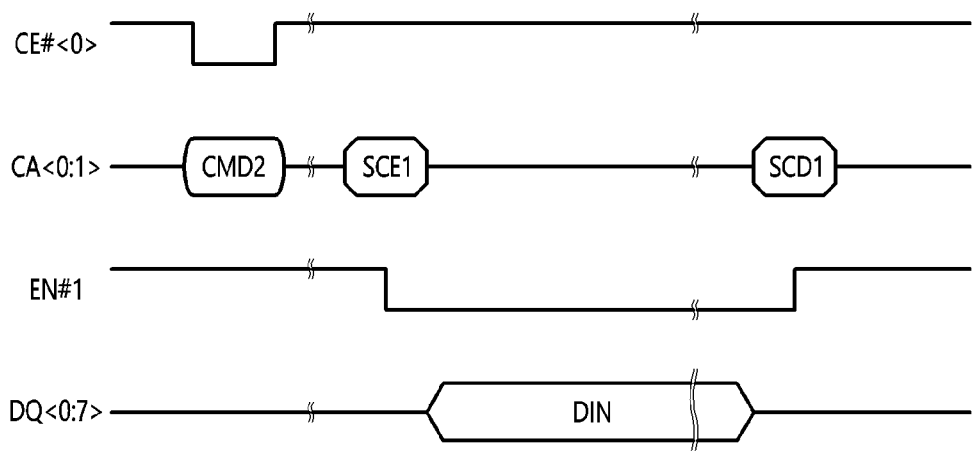
FIG. 2B is a diagram illustrating an operation of a semiconductor system according to an embodiment of the present technology.

FIG. 2B is a diagram illustrating an operation of the semiconductor system 100 according to an embodiment of the present technology. FIG. 2B may illustrate the data input operation performed by the first memory die DIE1 of FIG. 1. Referring to FIGS. 1 and 2B, the first semiconductor apparatus 110 may provide the second semiconductor apparatus 120 with the first chip enable signal CE#<0> and the command address signals CA<0:1> corresponding to the first command address signal set, to instruct the first memory die DIE1 to perform the data input operation. The first command address signal set may include the data input command CMD2. The first memory die DIE1 may receive the data input command CMD2 as a valid command based on the enabled first chip enable signal CE#<0>, and perform an internal operation based on the data input command CMD2. The control circuit 132 of the first memory die DIE1 may generate the memory cell array control signal MCS and the buffer control signal BCS based on the data input command CMD2, and the page buffer group 134 may reset the latch values of the latch circuits.

After providing the second semiconductor apparatus 120 with the first chip enable signal CE#<0> and the first command address signal set, the first semiconductor apparatus 110 may provide the second semiconductor apparatus 120 with the command address signals CA<0:1> corresponding the second command address signal set. When providing the second semiconductor apparatus 120 with the second command address signal set, the first semiconductor apparatus 110 might not provide the second semiconductor apparatus 120 with the first chip enable signal CE#<0>. The first semiconductor apparatus 110 may maintain the first chip enable signal CE#<0> in a disabled state. The second command address signal set may include selection information for selecting the first memory die DIE1, and include the first selection chip enable command SCE1 and the first selection chip disable command SCD1. After providing the second semiconductor apparatus 120 with the first chip enable signal CE#<0> and the first command address signal set, the first semiconductor apparatus 110 may provide the second semiconductor apparatus 120 with the first selection chip enable command SCE1. The control circuit 132 may enable the first data enable signal EN#1 based on the first selection chip enable command SCE1. When the first data enable signal EN#1 is enabled, the data input/output circuit 133 may be connected to the data bus 104. The first semiconductor apparatus 110 may provide the second semiconductor apparatus 120 with the data DQ<0:7> and DIN through the data bus 104 after providing the second semiconductor apparatus 120 with the first selection chip enable command SCE1. The data input/output circuit 133 may receive the data DIN through the data bus 104, parallelize the received data DIN, and generate the internal data DATA21 of the first memory die DIE1. The data input/output circuit 133 may provide the page buffer group 134 with the internal data DATA22. After providing the second semiconductor apparatus 120 with the data DIN, the first semiconductor apparatus 110 may provide the second semiconductor apparatus 120 with the first selection chip disable command SCE1. In an embodiment, the first semiconductor apparatus 110 may provide the second semiconductor apparatus 120 with the first selection chip disable command SCD1 at the point of time at which the data DIN is completely transmitted to the second semiconductor apparatus 120. In an embodiment, the first semiconductor apparatus 110 may provide the second semiconductor apparatus 120 with the first selection chip disable command SCD1 when a predetermined time elapses after providing the second semiconductor apparatus 120 with the first selection chip enable command SCE1. The control circuit 132 may disable the first data enable signal EN#1 based on the first selection chip disable command SCD1. When the first data enable signal EN#1 is disabled, the data input/output circuit 133 may be disconnected from the data bus 104.

FIG. 3A is a diagram illustrating an operation of the semiconductor system 100 according to an embodiment of the present technology. FIG. 3A may illustrate that the first and second memory dies DIE1 and DIE2 of FIG. 1 perform an interleaved data output operation. Referring to FIGS. 1 and 3A, the first semiconductor apparatus 110 may provide the second semiconductor apparatus 120 with the first chip enable signal CE#<0> and the command address signals CA<0:1> corresponding to the first command address signal set, to instruct the first memory die DIE1 to perform the data output operation. The first command address signal set may include the data output command CMD1. The first memory die DIE1 may receive the data output command CMD1 as a valid command based on the enabled first chip enable signal CE#<0>, and perform an internal operation based on the data output command CMD1. The control circuit 132 of the first memory die DIE1 may generate the memory cell array control signal MCS and the buffer control signal BCS based on the data output command CMD1, and the page buffer group 134 may read data stored in the memory cell array 131, and generate the internal data DATA21 of the first memory die DIE1. The data input/output circuit 133 may serialize the internal data DATA21, and generate the data DQ<0:7>.

After providing the second semiconductor apparatus 120 with the first chip enable signal CE#<0> and the first command address signal set, the first semiconductor apparatus 110 may provide the second semiconductor apparatus 120 with the command address signals CA<0:1> corresponding the second command address signal set. When providing the second semiconductor apparatus 120 with the second command address signal set, the first semiconductor apparatus 110 might not provide the second semiconductor apparatus 120 with the first chip enable signal CE#<0>. The first semiconductor apparatus 110 may maintain the first chip enable signal CE#<0> in a disabled state. The second command address signal set may include selection information for selecting the first memory die DIE1, and include the first selection chip enable command SCE1 and the first selection chip disable command SCD1. After providing the second semiconductor apparatus 120 with the first chip enable signal CE#<0> and the first command address signal set, the first semiconductor apparatus 110 may provide the second semiconductor apparatus 120 with the first selection chip enable command SCE1. The control circuit 132 may enable the first data enable signal EN#1 based on the first selection chip enable command SCE1. When the first data enable signal EN#1 is enabled, the data input/output circuit 133 may be connected to the data bus 104, and transmit the data DQ<0:7> and DOUT1 to the first semiconductor apparatus 110 through the data bus 104.

To allow the data output operation of the second memory die DIE2 to be performed in parallel, the first semiconductor apparatus 110 may provide the second semiconductor apparatus 120 with the first chip enable signal CE#<0> and the first command address signal set, and then provide the second semiconductor apparatus 120 with the second chip enable signal CE#<1> instructing the second memory die DIE2 to perform the data output operation and the command address signals CA<0:1> corresponding to the first command address signal set. The first command address signal set may include the data output command CMD1. The second memory die DIE2 may receive the data output command CMD1 as a valid command based on the enabled second chip enable signal CE#<1>, and perform an internal operation based on the data output command CMD1. Although FIG. 3A illustrates that the second chip enable signal CE#<1> and the data output command CMD1 are transmitted later than the first selection chip enable command SCE1, the point of time at which the first semiconductor apparatus 110 provides the second semiconductor apparatus 120 with the second chip enable signal CE#<1> and the data output command CMD1 may be earlier or later than the point of time at which the first semiconductor apparatus 110 provides the second semiconductor apparatus 120 with the first selection chip enable command SCE1. It may safely be said that the point of time at which the second chip enable signal CE#<1> and the data output command CMD1 are transmitted from the first semiconductor apparatus 110 to the second semiconductor apparatus 120 overlaps with the point of time at which the second semiconductor apparatus 120 transmits the data DQ<0:7> to the first semiconductor apparatus 110 through the data bus 104. Because the second chip enable signal CE#<1> is enabled when the data output command CMD1 is transmitted, the first memory die DIE1 might not receive the data output command CMD1 as a valid command. In addition, the second memory die DIE2 may be in a state of not being connected to the data bus 104.

The first semiconductor apparatus 110 may provide the second semiconductor apparatus 120 with the first selection chip disable command SCD1 after providing the second semiconductor apparatus 120 with the first selection chip enable command SCE1. The control circuit 132 may disable the first data enable signal EN#1 based on the first selection chip disable command SCD1. When the first data enable signal EN#1 is disabled, the data input/output circuit 133 may be disconnected from the data bus 104.

After providing the second semiconductor apparatus 120 with the first selection chip disable command SCD1, the first semiconductor apparatus 110 may provide the second semiconductor apparatus 120 with the command address signals CA<0:1> corresponding to the third command address signal set. When providing the second semiconductor apparatus 120 with the third command address signal set, the first semiconductor apparatus 110 might not provide the second semiconductor apparatus 120 with the second chip enable signal CE#<1>. The third command address signal set may include selection information for selecting the second memory die DIE2, and include the second selection chip enable command SCE2 and the second selection chip disable command SCD2. After providing the second semiconductor apparatus 120 with the second selection chip enable command SCE2, the first semiconductor apparatus 110 may provide the second semiconductor apparatus 120 with the second selection chip disable command SCD2. The control circuit 142 of the second die DIE2 may enable the second data enable signal EN#2 based on the second selection chip enable command SCE2. When the second data enable signal EN#2 is enabled, the data input/output circuit 143 may be connected to the data bus 104, and transmit the data DQ<0:7> and DOUT2 to the first semiconductor apparatus 110 through the data bus 104.

After providing the second semiconductor apparatus 120 with the second selection chip enable command SCE2, the first semiconductor apparatus 110 may provide the second semiconductor apparatus 120 with the second selection chip disable command SCD2. The control circuit 142 may disable the second data enable signal EN#2 based on the second selection chip disable command SCD2. When the second data enable signal EN#2 is disabled, the data input/output circuit 143 may be disconnected from the data bus 104. The first semiconductor apparatus 110 may provide the second semiconductor apparatus 120 with the first and second selection chip enable commands SCE1 and SCE2 and the first and second selection chip disable commands SCD1 and SCD2, and thus may independently set data output periods of the first and second memory dies DIE1 and DIE2, which makes it possible for the first and second memory dies DIE1 and DIE2 to perform the data output operation in parallel.

FIG. 3B is a diagram illustrating an operation of the semiconductor system 100 according to an embodiment of the present technology. FIG. 3B may illustrate that the first and second memory dies DIE1 and DIE2 of FIG. 1 perform an interleaved data input operation. Referring to FIGS. 1 and 3B, the first semiconductor apparatus 110 may provide the second semiconductor apparatus 120 with the first chip enable signal CE#<0> and the command address signals CA<0:1> corresponding to the first command address signal set, to instruct the first memory die DIE1 to perform the data input operation. The first command address signal set may include the data input command CMD2. The first memory die DIE1 may receive the data input command CMD2 as a valid command based on the enabled first chip enable signal CE#<0>, and perform an internal operation based on the data input command CMD2. The control circuit 132 of the first memory die DIE1 may generate the memory cell array control signal MCS and the buffer control signal BCS based on the data input command CMD2, and the page buffer group 134 may reset the latch values of the latch circuits.

After providing the second semiconductor apparatus 120 with the first chip enable signal CE#<0> and the first command address signal set, the first semiconductor apparatus 110 may provide the second semiconductor apparatus 120 with the command address signals CA<0:1> corresponding to the second command address signal set. When providing the second semiconductor apparatus 120 with the second command address signal set, the first semiconductor apparatus 110 may maintain the first chip enable signal CE#<0> in a disabled state. The second command address signal set may include selection information for selecting the first memory die DIE1, and include the first selection chip enable command SCE1 and the first selection chip disable command SCD1. After providing the second semiconductor apparatus 120 with the first chip enable signal CE#<0> and the first command address signal set, the first semiconductor apparatus 110 may provide the second semiconductor apparatus 120 with the first selection chip enable command SCE1. The control circuit 132 may enable the first data enable signal EN#1 based on the first selection chip enable command SCE1. When the first data enable signal EN#1 is enabled, the data input/output circuit 133 may be connected to the data bus 104. After providing the second semiconductor apparatus 120 with the first selection chip enable command SCE1, the first semiconductor apparatus 110 may provide the second semiconductor apparatus 120 with the data DQ<0:7> and DIN1. The data input/output circuit 133 may receive the data DIN1 through the data bus 104, parallelize the received data DIN1, and generate the internal data DATA21 of the first memory die DIE1.

To allow the data input operation of the second memory die DIE2 to be performed in parallel, the first semiconductor apparatus 110 may provide the second semiconductor apparatus 120 with the first chip enable signal CE#<0> and the first command address signal set, and then provide the second semiconductor apparatus 120 with the second chip enable signal CE#<1> instructing the second memory die DIE2 to perform the data input operation and the command address signals CA<0:1> corresponding to the first command address signal set. The first command address signal set may include the data input command CMD2. The second memory die DIE2 may receive the data input command CMD2 as a valid command based on the enabled second chip enable signal CE#<1>, and perform an internal operation based on the data input command CMD2. Although FIG. 3B illustrates that the second chip enable signal CE#<1> and the data input command CMD2 are transmitted later than the first selection chip enable command SCE1, the point of time at which the first semiconductor apparatus 110 provides the second semiconductor apparatus 120 with the second chip enable signal CE#<1> and the data input command CMD2 may be earlier or later than the point of time at which the first semiconductor apparatus 110 provides the second semiconductor apparatus 120 with the first selection chip enable command SCE1. It may safely be said that the point of time at which the second chip enable signal CE#<1> and the data input command CMD2 are transmitted from the first semiconductor apparatus 110 to the second semiconductor apparatus 120 overlaps with the point of time at which the first semiconductor apparatus 110 transmits the data DIN1 to the second semiconductor apparatus 120 through the data bus 104. Because the second chip enable signal CE#<1> is enabled when the data input command CMD2 is transmitted, the first memory die DIE1 might not receive the data input command CMD2 as a valid command. In addition, because the second memory die DIE2 is in a state of not being connected to the data bus 104, the second memory die DIE2 might not receive the data DIN1 from the first semiconductor apparatus 110.

The first semiconductor apparatus 110 may provide the second semiconductor apparatus 120 with the first selection chip disable command SCD1 after providing the second semiconductor apparatus 120 with the data DIN1. The control circuit 132 may disable the first data enable signal EN#1 based on the first selection chip disable command SCD1. When the first data enable signal EN#1 is disabled, the data input/output circuit 133 may be disconnected from the data bus 104.

After providing the second semiconductor apparatus 120 with the first selection chip disable command SCD1, the first semiconductor apparatus 110 may provide the second semiconductor apparatus 120 with the command address signals CA<0:1> corresponding to the third command address signal set. When providing the second semiconductor apparatus 120 with the third command address signal set, the first semiconductor apparatus 110 may maintain the second chip enable signal CE#<1> in a disabled state. The third command address signal set may include selection information for selecting the second memory die DIE2, and include the second selection chip enable command SCE2 and the second selection chip disable command SCD2. After providing the second semiconductor apparatus 120 with the second selection chip enable command SCE2, the first semiconductor apparatus 110 may provide the second semiconductor apparatus 120 with the second selection chip disable command SCD2. The control circuit 142 may enable the second data enable signal EN#2 based on the second selection chip enable command SCE2. When the second data enable signal EN#2 is enabled, the data input/output circuit 143 may be connected to the data bus 104.

After providing the second semiconductor apparatus 120 with the second selection chip enable command SCE2, the first semiconductor apparatus 110 may provide the second semiconductor apparatus 120 with the data DQ<0:7> and DIN2. The data input/output circuit 144 may receive the data DIN2 through the data bus 104, parallelize the received data DIN2, and generate the internal data DATA22 of the second memory die DIE2. After providing the second semiconductor apparatus 120 with the data DIN2, the first semiconductor apparatus 110 may provide the second semiconductor apparatus 120 with the second selection chip disable command SCD2. The control circuit 142 may disable the second data enable signal EN#2 based on the second selection chip disable command SCD2. When the second data enable signal EN#2 is disabled, the data input/output circuit 143 may be disconnected from the data bus 104. The first semiconductor apparatus 110 may provide the second semiconductor apparatus 120 with the first and second selection chip enable commands SCE1 and SCE2 and the first and second selection chip disable commands SCD1 and SCD2, and thus may independently set data input periods of the first and second memory dies DIE1 and DIE2, which makes it possible for the first and second memory dies DIE1 and DIE2 to perform the data input operation in parallel.

FIG. 4 is a diagram illustrating an operation of the semiconductor system 100 according to an embodiment of the present technology. FIG. 4 may illustrate that the first memory die DIE1 of FIG. 1 performs the data output operation. Referring to FIGS. 1 and 4, the first semiconductor apparatus 110 may provide the second semiconductor apparatus 120 with the first chip enable signal CE#<0> and the command address signals CA<0:1> corresponding to the first command address signal set, to instruct the first memory die DIE1 to perform the data output operation. The first command address signal set may include the data output command CMD1. The control circuit 132 of the first memory die DIE1 may receive the data output command CMD1 as a valid command based on the enabled first chip enable signal CE#<0>, and perform an internal operation based on the data output command CMD1. After providing the second semiconductor apparatus 120 with the first chip enable signal CE#<0> and the first command address signal set, the first semiconductor apparatus 110 may provide the second semiconductor apparatus 120 with the second command address signal set. When providing the second semiconductor apparatus 120 with the second command address signal set, the first semiconductor apparatus 110 may maintain the first chip enable signal CE#<0> in a disabled state. The second command address signal set may include selection information for selecting the first memory die DIE1, and include the first selection chip enable command SCE1 and a first selection chip termination command SCT1. After providing the second semiconductor apparatus 120 with the first chip enable signal CE#<0> and the data output command CMD1, the first semiconductor apparatus 110 may provide the second semiconductor apparatus 120 with the first selection chip enable command SCE1. The control circuit 132 may enable the first data enable signal EN#1 based on the first selection chip enable command SCE1. When the first data enable signal EN#1 is enabled, the data input/output circuit 133 may be connected to the data bus 104, and transmit the data DQ<0:7> and DOUT to the first semiconductor apparatus 110 through the data bus 104. After providing the second semiconductor apparatus 120 with the first selection chip enable command SCE1, the first semiconductor apparatus 110 may provide the second semiconductor apparatus 120 with the first selection chip termination command SCT1. When the first memory die DIE1 does not need to perform another operation other than the data output operation instructed by the data output command CMD1, the first semiconductor apparatus 110 may provide the second semiconductor apparatus 120 with the first selection chip termination command SCT1 instead of the first selection chip disable command SCD1 of FIG. 2A. In an embodiment, the first semiconductor apparatus 110 may provide the second semiconductor apparatus 120 with the first selection chip termination command SCT1 at the point of time at which the data DOUT is completely transmitted from the second semiconductor apparatus 120. In an embodiment, the first semiconductor apparatus 110 may provide the second semiconductor apparatus 120 with the first selection chip termination command SCT1 when a predetermined time elapses after providing the second semiconductor apparatus 120 with the first selection chip enable command SCE1. The control circuit 132 may disable the first data enable signal EN#1 based on the first selection chip termination command SCT1. When the first data enable signal EN#1 is disabled, the data input/output circuit 133 may be disconnected from the data bus 104. In addition, the first memory die DIE1 may enter a low power mode based on the first selection chip termination command SCT1. The low power mode may be a standby mode in which a normal operation is not performed, and may include a power-down mode, a deep power-down mode, and a sleep mode. In FIG. 2A, when the first semiconductor apparatus 110 provides the first selection chip disable command SCD1, the first memory die DIE1 may be in a ready state, not the low power mode, and maintain an activated state to perform another operation. When the first memory die DIE1 does not need to perform another operation, the first semiconductor apparatus 110 may need to allow the first memory die DIE1 to enter the low power mode by typically providing a low power mode entry command. The first semiconductor apparatus 110 may disconnect the first memory die 110 from the data bus 104 by providing the first selection chip termination command SCT1, and instruct the first memory die DIE1 to enter the low power mode. Accordingly, the number of commands used when the first memory die DIE1 enters the low power mode and command overhead may be reduced, and performance of the semiconductor system 100 may be improved.

Figure 5:
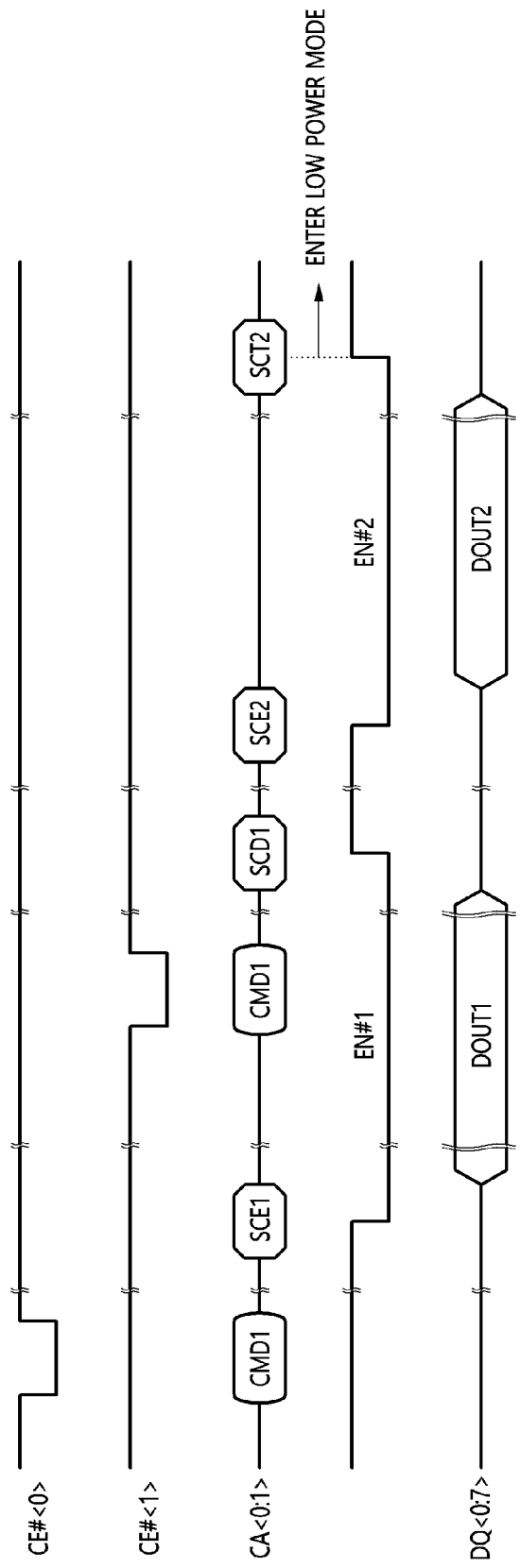
FIG. 5 is a diagram illustrating an operation of a semiconductor system according to an embodiment of the present technology.

FIG. 5 is a diagram illustrating an operation of the semiconductor system 100 according to an embodiment of the present technology. FIG. 5 may illustrate that the first and second memory dies DIE1 and DIE2 of FIG. 1 perform an interleaved data output operation. Referring to FIGS. 1 and 5, the first semiconductor apparatus 110 may provide the second semiconductor apparatus 120 with the first chip enable signal CE#<0> and the command address signals CA<0:1> corresponding to the first command address signal set, to instruct the first memory die DIE1 to perform the data output operation. The first command address signal set may include the data output command CMD1. The first memory die DIE1 may receive the data output command CMD1 as a valid command based on the enabled first chip enable signal CE#<0>, and perform an internal operation based on the data output command CMD1.

After providing the second semiconductor apparatus 120 with the first chip enable signal CE#<0> and the first command address signal set, the first semiconductor apparatus 110 may provide the second semiconductor apparatus 120 with the first selection chip enable command SCE1. The control circuit 132 may enable the first data enable signal EN#1 based on the first selection chip enable command SCE1. When the first data enable signal EN#1 is enabled, the data input/output circuit 133 may be connected to the data bus 104, and transmit the data DQ<0:7> and DOUT1 to the first semiconductor apparatus 110 through the data bus 104.

To allow the data output operation of the second memory die DIE2 to be performed in parallel, the first semiconductor apparatus 110 may provide the second semiconductor apparatus 120 with the first chip enable signal CE#<0> and the first command address signal set, and then provide the second semiconductor apparatus 120 with the second chip enable signal CE#<1> instructing the second memory die DIE2 to perform the data output operation and the command address signals CA<0:1> corresponding to the first command address signal set. The first command address signal set may include the data output command CMD1. The second memory die DIE2 may receive the data output command CMD1 as a valid command based on the enabled second chip enable signal CE#<1>, and perform an internal operation based on the data output command CMD1.

After providing the second semiconductor apparatus 120 with the first selection chip enable command SCE1, the first semiconductor apparatus 110 may provide the second semiconductor apparatus 120 with the first selection chip disable command SCD1. The control circuit 132 may disable the first data enable signal EN#1 based on the first selection chip disable command SCD1. When the first data enable signal EN#1 is disabled, the data input/output circuit 133 may be disconnected from the data bus 104, and the first memory die DIE1 may be in a ready state where another operation can be performed. In an embodiment, when the first memory die DIE1 does not need to perform another operation, the first semiconductor apparatus 110 may provide the second semiconductor apparatus 120 with the first selection chip termination command SCT1 illustrated in FIG. 4 instead of the first selection chip disable command SCD1. When the first selection chip termination command SCT1 is provided from the first semiconductor apparatus 110, the first memory die DIE1 may enter a low power mode.

After providing the second semiconductor apparatus 120 with the first selection chip disable command SCD1, the first semiconductor apparatus 110 may provide the second semiconductor apparatus 120 with the second selection chip enable command SCE2. The control circuit 142 may enable the second data enable signal EN#2 based on the second selection chip enable command SCE2. When the second data enable signal EN#2 is enabled, the data input/output circuit 143 may be connected to the data bus 104, and transmit the data DQ<0:7> and DOUT2 to the first semiconductor apparatus 110 through the data bus 104.

After providing the second semiconductor apparatus 120 with the second selection chip enable command SCE2, the first semiconductor apparatus 110 may provide the second semiconductor apparatus 120 with the second selection chip termination command SCT2. The control circuit 142 may disable the second data enable signal EN#2 based on the second selection chip termination command SCT2. When the second data enable signal EN#2 is disabled, the data input/output circuit 143 may be disconnected from the data bus 104. In addition, the second memory die DIE2 may enter the low power mode based on the second selection chip termination command SCT2. In an embodiment, when the second memory die DIE2 needs to perform another operation, the first semiconductor apparatus 110 may provide the second semiconductor apparatus 120 with the second selection chip disable command SCD2 illustrated in FIG. 3A instead of the second selection chip termination command SCT2. When the second selection chip disable command SCD2 is provided from the first semiconductor apparatus 110, the second memory die DIE2 may be in a ready state where another operation can be performed, without entering the low power mode.

Figure 6:
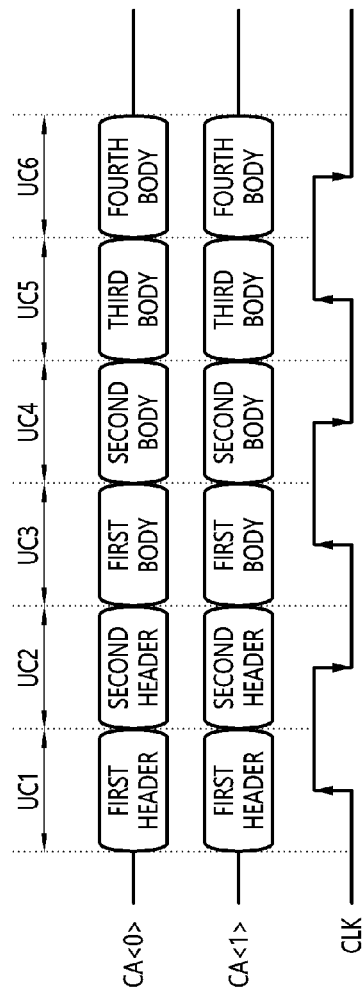
FIG. 6 is a diagram illustrating a construction of a command address signal according to an embodiment of the present technology.

FIG. 6 is a diagram illustrating constructions of the command address signals CA<0> and CA<1> according to an embodiment of the present technology. Referring to FIG. 6, the command address signals CA<0> and CA<1> transmitted during a unit cycle may include 2 bits, and a total of 12-bit command address signals transmitted during 6 unit cycles may constitute one command address signal set. A first header and a second header of the command address signal set may be transmitted during a first unit cycle UC1 and a second unit cycle UC2, respectively. During the first unit cycle UC1, the first and second bits CA<0> and CA<1> of the first header may be transmitted, and during the second unit cycle UC2, the first and second bits CA<0> and CA<1> of the second header may be transmitted. A first body, a second body, a third body and a fourth body of the command address signal set may be transmitted during a third unit cycle UC3, a fourth unit cycle UC4, a fifth unit cycle UC5 and a sixth unit cycle UC6, respectively. During the third unit cycle US3, the first and second bits CA<0> and CA<1> of the first body may be transmitted, and during the fourth unit cycle UC4, the first and second bits CA<0> and CA<1> of the second body may be transmitted. During the fifth unit cycle UC5, the first and second bits CA<0> and CA<1> of the third body may be transmitted, and during the sixth unit cycle UC6, the first and second bits CA<0> and CA<1> of the fourth body may be transmitted. The command address signal set may be transmitted in synchronization with the command clock signal CCK. The command address signals CA<0> and CA<1> may be transmitted in synchronization with rising edges and falling edges of the command clock signal CCK. For example, the first unit cycle UC1 may be synchronized with a first rising edge of the command clock signal CCK, and the first and second bits CA<0> and CA<1> of the first header may be transmitted in synchronization with the first rising edge of the command clock signal CCK. The second unit cycle UC2 may be synchronized with a first falling edge of the command clock signal CCK, and the first and second bits CA<0> and CA<1> of the second header may be transmitted in synchronization with the first falling edge of the command clock signal CCK. The third unit cycle UC3 may be synchronized with a second rising edge of the command clock signal CCK, and the first and second bits CA<0> and CA<1> of the first body may be transmitted in synchronization with the second rising edge of the command clock signal CCK. The fourth unit cycle UC4 may be synchronized with a second falling edge of the command clock signal CCK, and the first and second bits CA<0> and CA<1> of the second body may be transmitted in synchronization with the second falling edge of the command clock signal CCK. The fifth unit cycle UC5 may be synchronized with a third rising edge of the command clock signal CCK, and the first and second bits CA<0> and CA<1> of the third body may be transmitted in synchronization with the third rising edge of the command clock signal CCK. The sixth unit cycle UC6 may be synchronized with a third falling edge of the command clock signal CCK, and the first and second bits CA<0> and CA<1> of the fourth body may be transmitted in synchronization with the third falling edge of the command clock signal CCK.

FIG. 7 is a table illustrating the command address signal set according to an embodiment of the present technology. Referring to FIG. 7, the command address signal set may specify characteristics and/or types of the command address signal set depending on logic levels of the bits CA<0> and CA<1> of the first and second headers. When the first and second bits CA<0> and CA<1> of the first and second headers each have a low logic level, the command address signal set may correspond to the data output command Data Output. When the first and second bits CA<0> and CA<1> of the first header and the first bit CA<0> of the second header each have the low logic level, and the second bit CA<1> of the second header has a high logic level, the command address signal set may correspond to the data input command Data Input. When the first bit CA<0> of the first header has the high logic level, and the second bit CA<1> of the first header and the first and second bits CA<0> and CA<1> of the second header each have the low logic level, the command address signal set may correspond to address input Address Input, and the bodies transmitted after the first and second headers may be provided as address signals. When the first bit CA<0> of the first header and the first and second bits CA<0> and CA<1> of the second header each have the low logic level, and the second bit CA<1> of the first header has the high logic level, the command address signal set may correspond to command input Command Input, and the bodies transmitted after the first and second headers may include information about the type of commands defined by the command address signal set.

When the first and second bits CA<0> and CA<1> of the first header and the first bit CA<0> of the second header each have the high logic level, and the second bit CA<1> of the second header has the low logic level, the command address signal set may correspond to the selection chip enable command SCE. The bodies transmitted after the first and second headers may include selection information for selecting a memory die receiving the selection chip enable command SCE. When the first and second bits CA<0> and CA<1> of the first header and the second bit CA<1> of the second header each have the high logic level, and the first bit CA<0> of the second header has the low logic level, the command address signal set may correspond to the selection chip disable command SCD. The bodies transmitted after the first and second headers may include selection information for selecting a memory die receiving the selection chip disable command SCD. When the first and second bits CA<0> and CA<1> of the first header and the first and second bits CA<0> and CA<1> of the second header each have the high logic level, the command address signal set may correspond to the selection chip termination command SCT. The bodies transmitted after the first and second headers may include selection information for selecting a memory die receiving the selection chip termination command SCT. When the first and second bits CA<0> and CA<1> of the first header each have the high logic level, and the first and second bits CA<0> and CA<1> of the second header each have the low logic level, the command address signal set may correspond to a logical unit number (LUN) selection command LUN Selection. The bodies transmitted after the first and second headers may include selection information for selecting a memory die receiving the LUN selection command LUN Selection.

The first and second bits CA<0> and CA<1> of the first to fourth bodies transmitted after the first and second headers of the selection chip enable command SCE, the selection chip disable command SCD, the selection chip termination command SCT, and the LUN selection command LUN Selection may be used as information for selecting a plurality of memory dies. The first and second bits CA<0> and CA<1> of the first and fourth bodies may be used as information for selecting different memory dies, and 256 different memory dies may be selected independently by logic values of the body bits. For example, when the first bit of the first body to the second bit of the fourth body S0, S1, S2, S3, S4, S5, S6 and S7 each have the low logic level, a first memory die may be selected. When the first bit S0 of the first body has the high logic level, and the second bit of the first body to the second bit of the fourth body S1, S2, S3, S4, S5, S6 and S7 each have the low logic level, a second memory die may be selected. When the second bit S1 of the first body has the high logic level, and the first bit S0 of the first body and the first bit of the second body to the second bit of the fourth body S2, S3, S4, S5, S6 and S7 each have the low logic level, a third memory die may be selected. When the first bit of the first body to the second bit of the fourth body S0, S1, S2, S3, S4, S5, S6 and S7 each have the high logic level, a 256th memory die may be selected. The control circuits 132 and 142 illustrated in FIG. 1 may determine logic levels of header bits and body bits constituting the command address signal set, and receive the command address signal set as the data output command CMD1, the data input command CMD2, the first selection chip enable command SCE1, the first selection chip disable command SCD1, the first selection chip termination command SCT1, the second selection chip enable command SCE2, the second selection chip disable command SCD2, and the second selection chip termination command SCT2.

Figure 8A:
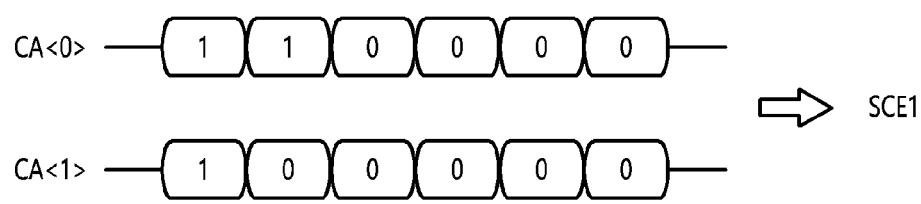
FIG. 8A is a diagram illustrating an example of a construction of a selection chip enable command according to an embodiment of the present technology.

FIG. 8A is a diagram illustrating an example of a construction of the selection chip enable command according to an embodiment of the present technology. When the first and second bits CA<0> and CA<1> of the first header of the command address signal set and the first bit CA<0> of the second header each have the high logic level, and the second bit CA<1> of the second header has the low logic level, the command address signal set may correspond to the selection chip enable command SCE of FIG. 7. Because all body bits each have the low logic level, the command address signal set may include selection information for selecting the first memory die DIE1. Accordingly, the command address signal set may correspond to the first selection chip enable command SCE1 illustrated in FIGS. 2A to 5.

Figure 8B:
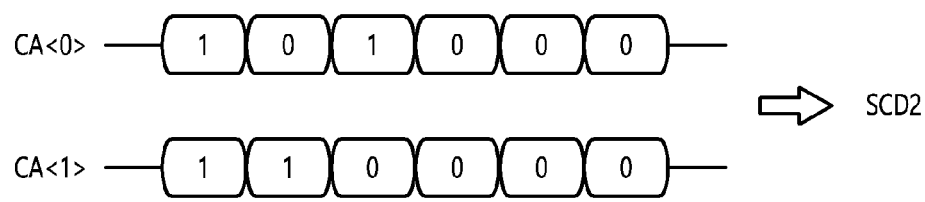
FIG. 8B is a diagram illustrating an example of a construction of a selection chip disable command according to an embodiment of the present technology.

FIG. 8B is a diagram illustrating an example of a construction of the selection chip disable command according to an embodiment of the present technology. When the first and second bits CA<0> and CA<1> of the first header of the command address signal set and the second bit CA<1> of the second header each have the high logic level, and the first bit CA<0> of the second header has the low logic level, the command address signal set may correspond to the selection chip disable command SCD of FIG. 7. Because the first bit CA<0> of the first body has the high logic level and all other body bits each have the low logic level, the command address signal set may include selection information for selecting the second memory die DIE2. Accordingly, the command address signal set may correspond to the second selection chip disable command SCD2 illustrated in FIGS. 3A, 3B and 5.

A person skilled in the art to which the present disclosure pertains will understand that the present disclosure may be carried out in other specific forms without changing its technical spirit or essential features. Therefore, it should be understood that the embodiments described above are illustrative in all aspects, not limitative. The scope of the present disclosure is defined by the claims to be described below rather than the detailed description, and it should be construed that the meaning and scope of the claims and all changes or modified forms derived from the equivalent concept thereof are included in the scope of the present disclosure.

What is claimed is:

1. A semiconductor system comprising:
   a first semiconductor apparatus configured to provide a chip enable signal and a command address signal set and then provide a selection chip enable command and a selection chip disable command that define a data input/output period; and
   a second semiconductor apparatus configured to perform an internal operation based on the chip enable signal and the command address signal set, and connected to the first semiconductor apparatus through a data bus based on the selection chip enable command and the selection chip disable command.

2. The semiconductor system according to claim 1, wherein the command address signal set comprises at least one of a data output command and a data input command.

3. The semiconductor system according to claim 1, wherein
   the second semiconductor apparatus is connected to the data bus based on the selection chip enable command.

4. The semiconductor system according to claim 3, wherein
   the second semiconductor apparatus is disconnected from the data bus based on the selection chip disable command.

5. The semiconductor system according to claim 4, wherein the first semiconductor apparatus:
   receives data from the second semiconductor apparatus through the data bus after providing the second semiconductor apparatus with the selection chip enable command; and
   provides the second semiconductor apparatus with the selection chip disable command after receiving the data.

6. The semiconductor system according to claim 4, wherein the first semiconductor apparatus:
   provides the second semiconductor apparatus with data through the data bus after providing the second semiconductor apparatus with the selection chip enable command; and
   provides the second semiconductor apparatus with the selection chip disable command after providing the second semiconductor apparatus with the data.

7. A semiconductor system comprising:
   a first semiconductor apparatus configured to provide a chip enable signal and a command address signal set and then provide a selection chip enable command and a selection chip termination command that define a data input/output period; and
   a second semiconductor apparatus configured to perform an internal operation based on the chip enable signal and the command address signal set, to be connected to the first semiconductor apparatus through a data bus based on the selection chip enable command and the selection chip termination command, and to enter a low power mode based on the selection chip termination command.

8. The semiconductor system according to claim 7, wherein the first semiconductor apparatus:
receives data from the second semiconductor apparatus through the data bus after transmitting the selection chip enable command to the second semiconductor apparatus; and
provides the second semiconductor apparatus with the selection chip termination command after receiving the data.

9. The semiconductor system according to claim 7, wherein the first semiconductor apparatus:
provides the second semiconductor apparatus with data through the data bus after providing the second semiconductor apparatus with the selection chip enable command; and
transmits the selection chip termination command to the second semiconductor apparatus after providing the second semiconductor apparatus with the data.

10. A semiconductor system comprising:
a semiconductor apparatus configured to provide a first chip enable signal, a second chip enable signal, a first command address signal set, a second command address signal set, a first selection chip enable command, a first selection chip disable command, a second selection chip enable command, and a second selection chip disable command, wherein the semiconductor apparatus is connected to a data bus;
a first memory die configured to perform an internal operation based on the first chip enable signal and the first command address signal set, wherein the first memory die is connected to the data bus based on the first selection chip enable command and the first selection chip disable command; and
a second memory die configured to perform an internal operation based on the second chip enable signal and the second command address signal set, wherein the second memory die is connected to the data bus based on the second selection chip enable command and the second selection chip disable command.

11. The semiconductor system according to claim 10, wherein each of the first and second command address signal sets comprises at least one of a data input command and a data output command.

12. The semiconductor system according to claim 10, wherein each of the first selection chip enable command and the first selection chip disable command comprises selection information that selects the first memory die, and
each of the second selection chip enable command and the second selection chip disable command comprises selection information that selects the second memory die.

13. The semiconductor system according to claim 10, wherein
the first memory die is connected to the data bus based on the first selection chip enable command and disconnected from the data bus based on the first selection chip disable command.

14. The semiconductor system according to claim 13, wherein
the second memory die is connected to the data bus based on the second selection chip enable command and disconnected from the data bus based on the second selection chip disable command.

15. The semiconductor system according to claim 13, wherein the semiconductor apparatus provides the first chip enable signal and the command address signal set, and then provides the first memory die with the first selection chip enable command.

16. The semiconductor system according to claim 13, wherein the semiconductor apparatus provides the first memory die with the first selection chip disable command after providing data to the first memory die or receiving the data from the first memory die through the data bus.

17. The semiconductor system according to claim 14, wherein the semiconductor apparatus provides the second chip enable signal and the second command address signal set, and then provides the second memory die with the second selection chip enable command.

18. The semiconductor system according to claim 14, wherein the semiconductor apparatus provides the second memory die with the second selection chip disable command after providing data to the second memory die or receiving the data from the second memory die through the data bus.

19. The semiconductor system according to claim 14, wherein the semiconductor apparatus provides the first memory die with the first chip enable signal and the first command address signal set, and then provides the second memory die with the second chip enable signal and the second command address signal set.

20. The semiconductor system according to claim 19, wherein the semiconductor apparatus provides the first memory die with the first selection chip disable command, and then provides the second memory die with the second selection chip enable command.

21. A semiconductor system comprising:
a semiconductor apparatus configured to provide a first chip enable signal, a second chip enable signal, a first command address signal set, a second command address signal set, a first selection chip enable command, a first selection chip termination command, a second selection chip enable command, and a second selection chip termination command, wherein the semiconductor apparatus is connected to a data bus;
a first memory die configured to perform an internal operation based on the first chip enable signal and the first command address signal set, wherein the first memory die is connected to the data bus based on the first selection chip enable command and the first selection chip termination command; and
a second memory die configured to perform an internal operation based on the second chip enable signal and the second command address signal set, wherein the second memory die is connected to the data bus based on the second selection chip enable command and the second selection chip termination command.

22. The semiconductor system according to claim 21, wherein the first memory die is connected to the data bus based on the first selection chip enable command, and the first memory die is disconnected to the data bus and enters a low power mode based on the first selection chip termination command, and
the second memory die is connected to the data bus based on the second selection chip enable command, and the second memory die is disconnected to the data bus and enters the low power mode based on the second selection chip termination command.

23. The semiconductor system according to claim 10, wherein the first memory die comprises:

a control circuit configured to generate a data enable signal based on the first selection chip enable command and the first selection chip disable command; and a data input/output circuit connected to the data bus, the data input/output circuit configured to transmit data to the semiconductor apparatus or receive the data from the semiconductor apparatus based on the data enable signal.

24. The semiconductor system according to claim 23, wherein the control circuit enables the data enable signal based on the first selection chip enable command, and disables the data enable signal based on the first selection chip disable command.

25. The semiconductor system according to claim 10, wherein the second memory die comprises:

a control circuit configured to generate a data enable signal based on the second selection chip enable command and the second selection chip disable command; and a data input/output circuit connected to the data bus, the data input/output circuit configured to transmit data to the semiconductor apparatus or receive the data from the semiconductor apparatus based on the data enable signal.

26. The semiconductor system according to claim 25, wherein the control circuit enables the data enable signal based on the second selection chip enable command, and disables the data enable signal based on the second selection chip disable command.

27. An operating method of a semiconductor system, comprising:

providing, by a semiconductor apparatus, a first memory die with a first chip enable signal and a command address signal set;

providing, by the semiconductor apparatus, the first memory die with a first selection chip enable command;

receiving, by the semiconductor apparatus, data from the first memory die or transmitting, by the semiconductor apparatus, the data to the first memory die; and providing, by the semiconductor apparatus, the first memory die with one of a first selection chip disable command and a first selection chip termination command.

28. The operating method according to claim 27, further comprising performing, by the first memory die, an internal operation, after the providing the first chip enable signal and the command address signal set to the first memory die.

29. The operating method according to claim 27, wherein the first memory die is placed in a ready state based on the first selection chip disable command, and enters a low power mode based on the first selection chip termination command.

30. The operating method according to claim 27, further comprising providing, by the semiconductor apparatus, a second memory die with a second chip enable signal and the command address signal set, after the providing the first chip enable signal and the command address signal set to the first memory die.

31. The operating method according to claim 30, further comprising performing, by the second memory die, an internal operation, after the providing the second chip enable signal and the command address signal set to second memory die.

32. The operating method according to claim 30, further comprising providing, by the semiconductor apparatus, the second memory die with a second selection chip enable command, after the providing the one of the first selection chip disable command and the first selection chip termination command to the first memory die.

33. The operating method according to claim 32, further comprising receiving, by the semiconductor apparatus, the data from the second memory die or transmitting, by the semiconductor apparatus, the data to the second memory die, after the providing of the second selection chip enable command to the second memory die.

34. The operating method according to claim 33, further comprising providing, by the semiconductor apparatus, the second memory die with a second selection chip disable command, after the receiving of the data from the second memory die or the transmitting of the data to the second memory die, wherein the second memory die is placed in a ready state based on the second selection chip disable command.

35. The operating method according to claim 33, further comprising providing, by the semiconductor apparatus, the second memory die with a second selection chip termination command, after the receiving of the data from the second memory die or the transmitting of the data to the second memory die, wherein the second memory die enters a low power mode based on the second selection chip termination command.

* * * * *